United States Patent
Iguchi et al.

(10) Patent No.: US 8,179,225 B2
(45) Date of Patent: May 15, 2012

(54) CERAMIC ELECTRONIC COMPONENT, MANUFACTURING METHOD OF CERAMIC ELECTRONIC COMPONENT, AND PACKAGING METHOD OF CERAMIC ELECTRONIC COMPONENTS

(75) Inventors: Toshihiro Iguchi, Tokyo (JP); Akitoshi Yoshii, Tokyo (JP); Akira Goshima, Nikaho (JP); Kazuyuki Hasebe, Nikaho (JP)

(73) Assignee: TDK Corporation, Tokyo (JP)

( * ) Notice: Subject to any disclaimer, the term of this patent is extended or adjusted under 35 U.S.C. 154(b) by 601 days.

(21) Appl. No.: 12/350,528

(22) Filed: Jan. 8, 2009

(65) Prior Publication Data

US 2009/0207554 A1    Aug. 20, 2009

(30) Foreign Application Priority Data

Feb. 20, 2008   (JP) .................. 2008-039111

(51) Int. Cl.
*H01C 7/10* (2006.01)
*H01C 1/012* (2006.01)

(52) U.S. Cl. .......... 338/21; 338/260; 338/313; 338/332; 361/306.1; 361/306.3; 361/321.2; 361/321.4; 257/532; 257/634; 257/666; 257/700; 257/E23.118; 438/382; 438/384; 438/678; 438/763; 501/134

(58) Field of Classification Search .................... 338/21; 338/260, 313, 332; 361/306.1, 306.3, 321.2, 361/321.4; 257/532, 634, 666, 700, E23.118; 438/382, 384, 678, 763; 501/134

See application file for complete search history.

(56) References Cited

U.S. PATENT DOCUMENTS

| | | | | |
|---|---|---|---|---|
| 5,757,263 | A | * | 5/1998 | Ravindranathan ............. 338/21 |
| 6,087,923 | A | * | 7/2000 | Ahn et al. ....................... 338/21 |
| 6,791,163 | B2 | * | 9/2004 | Kishimoto et al. ........... 257/634 |
| 6,839,221 | B2 | | 1/2005 | Sugimoto et al. |
| 2002/0014949 | A1 | * | 2/2002 | Tanaka et al. ................ 338/313 |

FOREIGN PATENT DOCUMENTS

| | | |
|---|---|---|
| JP | A-61-93063 | 5/1986 |
| JP | A-61-217317 | 9/1986 |
| JP | A-04-056118 | 2/1992 |
| JP | A-6-204075 | 7/1994 |
| JP | A-10-241987 | 9/1998 |
| JP | A-2004-356305 | 12/2004 |
| JP | A-2006-270010 | 10/2006 |
| WO | WO 2006/001334 A1 | 1/2006 |

* cited by examiner

*Primary Examiner* — Dao H Nguyen
(74) *Attorney, Agent, or Firm* — Oliff & Berridge, PLC

(57) ABSTRACT

A ceramic electronic component has a chip element body having a conductor arranged inside, external electrodes, and a discrimination layer. The chip element body has first and second end faces facing each other, first and second side faces being perpendicular to the first and second end faces and facing each other, and third and fourth side faces being perpendicular to the first and second end faces and to the first and second side faces and facing each other. The external electrodes are formed on the first and second end faces, respectively, of the chip element body. The discrimination layer is provided on at least one side face out of the first side face and the second side face in the chip element body. The chip element body is comprised of a first ceramic. The discrimination layer is comprised of a second ceramic different from the first ceramic and has a color different from that of the third and fourth side faces.

8 Claims, 7 Drawing Sheets

Fig.7

| Conditions | Material | | | | | | | | ΔL*a*b* | | | | | | | Judgment | |
|---|---|---|---|---|---|---|---|---|---|---|---|---|---|---|---|---|---|
| | BaTiO₃ | | | Additives [mol%] | | | | | Color of discrimination layer | | | Color of 3rd or 4th side face | | | Difference of colors | Applicability |
| | [mol%] | BET [m²/g] | A/B | MgO | Y₂O₃ | MnO | V₂O₅ | (Ba,Ca)SiO₃ | L | a | b | L | a | b | L | |
| Comparative Example 1 | 100 | 3.5 | 1.004 | 2.0 | 2.0 | 0.2 | 0.06 | 3.0 | 80.9 | 17.9 | 28.1 | 80.2 | 17.3 | 27.9 | 0.7 | |
| Example 1 | 100 | 4.0 | 1.004 | 2.0 | 2.0 | 0.2 | 0.06 | 3.0 | 75.3 | 19.7 | 29.7 | 80.9 | 18.0 | 27.9 | -5.6 | ○ |
| Example 2 | 100 | 3.0 | 1.004 | 2.0 | 2.0 | 0.2 | 0.06 | 3.0 | 88.9 | 19.9 | 27.9 | 80.7 | 17.9 | 28.6 | 8.2 | ○ |
| Example 3 | 100 | 3.5 | 1.001 | 2.0 | 2.0 | 0.2 | 0.06 | 3.0 | 73.7 | 16.8 | 27.9 | 80.6 | 17.3 | 27.9 | -6.9 | ○ |
| Example 4 | 100 | 3.5 | 1.006 | 2.0 | 2.0 | 0.2 | 0.06 | 3.0 | 89.0 | 15.8 | 26.8 | 80.4 | 17.9 | 28.2 | 8.7 | ○ |
| Example 5 | 100 | 3.5 | 1.004 | 2.2 | 2.0 | 0.2 | 0.06 | 3.0 | 73.2 | 19.8 | 27.6 | 81.2 | 18.1 | 28.7 | -8.0 | ○ |
| Example 6 | 100 | 3.5 | 1.004 | 1.8 | 2.0 | 0.2 | 0.06 | 3.0 | 89.0 | 15.6 | 28.5 | 80.2 | 17.9 | 28.4 | 8.8 | ○ |
| Example 7 | 100 | 3.5 | 1.004 | 2.0 | 2.2 | 0.2 | 0.06 | 3.0 | 71.9 | 15.6 | 29.8 | 80.3 | 17.3 | 28.6 | -8.3 | ○ |
| Example 8 | 100 | 3.5 | 1.004 | 2.0 | 1.8 | 0.2 | 0.06 | 3.0 | 87.9 | 17.0 | 30.4 | 80.7 | 18.2 | 28.0 | 7.2 | ○ |
| Example 9 | 100 | 3.5 | 1.004 | 2.0 | 2.0 | 0.2 | 0.09 | 3.0 | 65.3 | 19.7 | 25.7 | 80.6 | 17.8 | 28.7 | -15.3 | ○ |
| Example 10 | 100 | 3.5 | 1.004 | 2.0 | 2.0 | 0.2 | 0.03 | 3.0 | 90.3 | 15.6 | 26.1 | 80.6 | 17.8 | 28.3 | 9.7 | ○ |
| Example 11 | 100 | 3.5 | 1.004 | 2.0 | 2.0 | 0.2 | 0.06 | 3.5 | 73.7 | 20.4 | 29.4 | 80.2 | 17.3 | 27.9 | -6.6 | ○ |
| Example 12 | 100 | 3.5 | 1.004 | 2.0 | 2.0 | 0.2 | 0.06 | 2.5 | 89.0 | 16.2 | 30.0 | 80.2 | 17.3 | 27.9 | 8.8 | ○ |

CERAMIC ELECTRONIC COMPONENT, MANUFACTURING METHOD OF CERAMIC ELECTRONIC COMPONENT, AND PACKAGING METHOD OF CERAMIC ELECTRONIC COMPONENTS

BACKGROUND OF THE INVENTION

1. Field of the Invention

The present invention relates to a ceramic electronic component, and a manufacturing method and packaging method thereof.

2. Related Background Art

There is a known ceramic electronic component having a chip element body formed in a rectangular parallelepiped shape, a plurality of conductor layers arranged so as to be opposed to each other inside the chip element body, and external electrodes formed on respective end faces of the chip element body. The ceramic electronic components of this configuration, after manufactured, are housed in respective recesses formed in a packaging material (cf. Japanese Patent Application Laid-open No. 61-217317).

SUMMARY OF THE INVENTION

For mounting each of the ceramic electronic components thus packaged, a suction carrier is used to suck an upper side face of the ceramic electronic component exposed from the recess of the packaging material, take the ceramic electronic component out of the packaging material, and mount it on a mounting substrate. Then the ceramic electronic component is mounted on the mounting substrate with the sucked side face up. A stray capacitance produced between the conductor layers and an external conductive component, a magnetic field produced in the conductor layers, etc. will differ depending upon whether the opposing direction of the conductor layers is parallel or perpendicular to the mounting substrate in a state in which the ceramic electronic component is mounted on the mounting substrate.

Therefore, the electrical characteristics of the ceramic electronic component differ depending upon the opposing direction of the conductor layers relative to the mounting substrate, which causes a problem of variation in the electrical characteristics. This is not limited only to the configuration wherein the plurality of conductor layers are opposed to each other inside the chip element body, but also applies to any ceramic electronic component in which a conductor is formed inside a chip element body, with the problem that its electrical characteristics vary depending upon an arrangement direction of the conductor. There is thus a demand for packaging the ceramic electronic components with their conductor arrangement directions being aligned, in order to always mount each ceramic electronic component with the same conductor arrangement direction.

In the completed ceramic electronic component, however, the conductor inside the chip element body is usually covered by a ceramic and external electrodes and thus the direction thereof cannot be visually recognized. Particularly, in a case where the end faces with the external electrodes thereon are square, every side face of the chip element body has the same shape and therefore the conductor arrangement direction cannot be judged from the shape.

An object of the present invention is therefore to provide a ceramic electronic component that permits us to determine an arrangement direction of a conductor arranged inside a chip element body, a manufacturing method thereof and a packaging method of ceramic electronic components that permits us to package the ceramic electronic components with their conductor arrangement directions being aligned.

The present invention provides a ceramic electronic component comprising: a chip element body having first and second end faces facing each other, first and second side faces being perpendicular to the first and second end faces and facing each other, and third and fourth side faces being perpendicular to the first and second end faces and to the first and second side faces and facing each other, the chip element body having a conductor arranged inside; external electrodes formed on the first and second end faces, respectively, of the chip element body; and a discrimination layer provided on at least one side face out of the first side face and the second side face in the chip element body, wherein the chip element body is comprised of a first ceramic, and wherein the discrimination layer is comprised of a second ceramic different from the first ceramic and has a color different from that of the third and fourth side faces.

In the present invention, the discrimination layer is comprised of the second ceramic different from the first ceramic and has the color different from that of the third and fourth side faces. When the side face with the discrimination layer of the chip element body is set as a side face to become parallel to the conductor arrangement direction or as a side face to become perpendicular to the conductor arrangement direction, it is easy to determine the conductor arrangement direction in the chip element body, based on the discrimination layer.

Preferably, the discrimination layer is provided so as to cover an entire area of the at least one side face. In this case, it is feasible to surely and readily confirm the color of the discrimination layer.

Preferably, the first ceramic and the second ceramic have the different colors resulting from a difference between degrees of sintering thereof. In this case, it is easy to provide the discrimination layer on the side face of the chip element body.

Preferably, the first ceramic and the second ceramic are different in particle sizes of particles contained in the respective ceramics. In this case, it is easy to provide the discrimination layer on the side face of the chip element body.

Preferably, the first ceramic and the second ceramic are different in additives contained in the respective ceramics. In this case, it is easy to provide the discrimination layer on the side face of the chip element body.

Preferably, the first ceramic and the second ceramic are different in composition ratios of materials contained in the respective ceramics. In this case, it is easy to provide the discrimination layer on the side face of the chip element body.

Preferably, the conductor comprises a plurality of conductors arranged in a laminate direction to the first side face and the second side face. In this case, it is feasible to determine the laminate direction of the conductors as the conductor arrangement direction.

The present invention provides a manufacturing method of a ceramic electronic component, comprising the steps of: obtaining a laminate body in which a plurality of first ceramic green layers are laminated together and in which a conductor pattern is provided; forming a second ceramic green layer of a material that can show a color after firing different from a color after firing of the first ceramic green layers, on at least one face out of faces opposed to each other in a laminate direction in the laminate body; cutting the laminate body with the second ceramic green layer thereon to obtain a plurality of laminate chips; and firing the plurality of laminate chips to obtain chip element bodies provided with a discrimination layer.

In the present invention, the second ceramic green layer is formed on at least one face of the mutually opposed faces of the laminate body to become a matrix of the chip element body, and thereafter the laminate body is cut into the chips, followed by firing. By this process, the discrimination layer made by firing of the second ceramic green layer is provided on at least one side face out of the mutually opposed side faces in the chip element body. Since the second ceramic green layer is formed of the material of the color after firing different from the color of the first ceramic green layers after firing, the discrimination layer has the color different from that of the side faces of the chip element body. When the side face with the discrimination layer of the chip element body is set as a side face to become parallel to the conductor arrangement direction or as a side face to become perpendicular to the conductor arrangement direction, it is easy to determine the conductor arrangement direction in the chip element body, based on the discrimination layer.

Preferably, the first ceramic green layers and the second ceramic green layer are different in particle sizes of particles contained in the respective layers. In this case, it is easy to provide the discrimination layer on the side face of the chip element body.

Preferably, the first ceramic green layers and the second ceramic green layer are different in additives contained in the respective layers. In this case, it is easy to provide the discrimination layer on the side face of the chip element body.

Preferably, the first ceramic green layers and the second ceramic green layer are different in composition ratios of materials contained in the respective layers. In this case, it is easy to provide the discrimination layer on the side face of the chip element body.

Preferably, the step of obtaining the plurality of laminate chips comprises cutting the laminate body so that the conductor pattern is exposed in a cut surface, and the method further comprises a step of forming an external electrode on the surface in which the conductor pattern is exposed in the chip element body.

Preferably, the step of obtaining the laminate body comprises providing a plurality of conductor patterns in a laminate direction of the plurality of first ceramic green layers. In this case, it is feasible to determine the laminate direction of conductors resulting from firing of the conductor patterns, as a conductor arrangement direction.

The present invention provides a packaging method of ceramic electronic components comprising: a preparation step of preparing a plurality of ceramic electronic components as set forth; a determination step of determining an arrangement direction of the conductor in each of the ceramic electronic components, based on the difference between the colors of at least one side face out of the third and fourth side faces, and the discrimination layer; and a packaging step of packaging the plurality of ceramic electronic components with the arrangement directions thereof being aligned, based on the arrangement directions determined in the determination step.

In the present invention, when the side face with the discrimination layer of the chip element body is set as a side face to become parallel to the conductor arrangement direction or as a side face to become perpendicular to the conductor arrangement direction, it becomes easy to determine the conductor arrangement direction in the chip element body, based on the discrimination layer. As a result, the ceramic electronic components can be packaged with their conductor arrangement directions being aligned.

Preferably, the determination step comprises discriminating the difference between the colors of the at least one side face out of the third and fourth side faces, and the discrimination layer, based on a difference between luminance values of the at least one side face out of the third and fourth side faces, and the discrimination layer. In this case, the accuracy is improved for determination of the difference of colors and it is thus feasible to accurately determine the conductor arrangement direction.

The present invention successfully provides the ceramic electronic component permitting the determination of the conductor arrangement direction and the manufacturing method thereof, and the packaging method of ceramic electronic components permitting the packaging with their conductor arrangement directions being aligned.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a drawing showing examples of ceramic electronic components according to the embodiment.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

Figure 1:
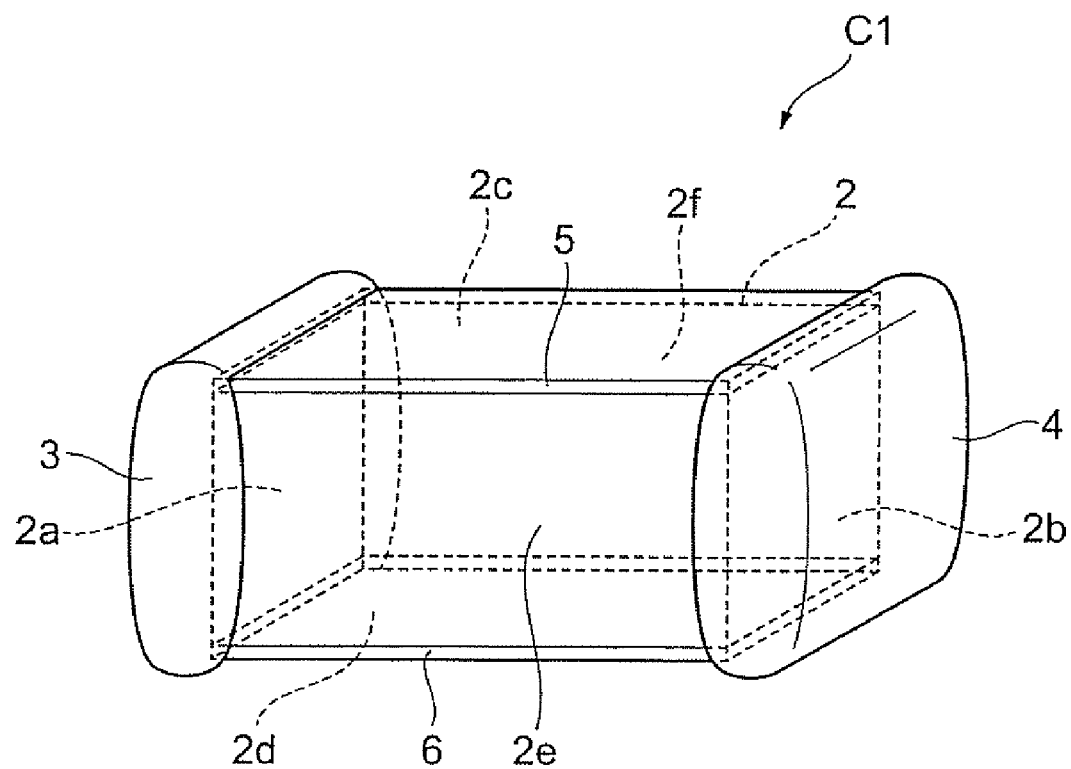
FIG. 1 is a perspective view of a ceramic electronic component according to an embodiment of the present invention.

FIG. 1 is a perspective view of a ceramic electronic component according to an embodiment of the present invention. The ceramic electronic component C1 of the present embodiment is a multilayer chip capacitor. The ceramic electronic component C1 is formed in a nearly rectangular parallelepiped shape and in the size of height of about 2.5 mm, width of about 2.5 mm, and length of about 3.2 mm; therefore, the size in the height direction is substantially equal to the size in the width direction and the end faces on which external electrodes are formed are square.

The ceramic electronic component C1 has a chip element body 2 of a nearly rectangular parallelepiped shape, first and second external electrodes 3, 4, and discrimination layers 5, 6. The first and second external electrodes 3, 4 are formed on the two end faces 2a, 2b, respectively, of the chip element body 2. The discrimination layers 5, 6 are provided on a first side face 2c and on a second side face 2d, respectively, as opposed to each other in the chip element body 2.

In the chip element body 2, the two end faces 2a, 2b face each other and the first side face 2c and the second side face 2d face each other and are perpendicular to the two end faces 2a, 2b. The chip element body 2 has a third side face 2e and a fourth side face 2f being perpendicular to the two end faces 2a, 2b and to the first and second side faces 2c, 2d and facing each other. The discrimination layers 5, 6 cover the entire areas of the first side face 2c and the second side face 2d, respectively, of the chip element body 2.

The first external electrode 3 is formed on the end face 2a of the chip element body 2, covers the entire area of the end face 2a, and covers a part of each of the discrimination layers 5, 6 and the third and fourth side faces 2e, 2f. The second external electrode 4 is formed on the end face 2b of the chip element body 2, covers the entire area of the end face 2b, and covers a part of each of the discrimination layers 5, 6 and the third and fourth side faces 2e, 2f.

Figure 2:
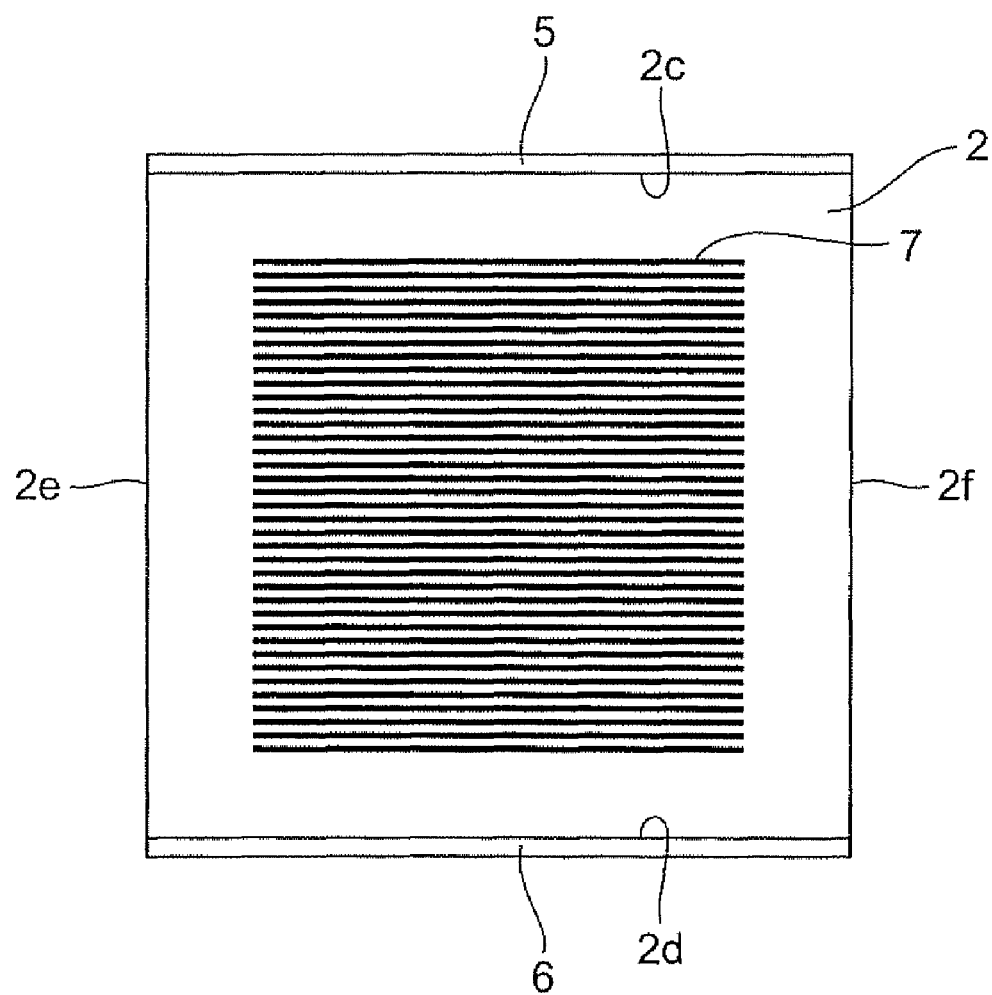
FIG. 2 is a sectional view of the ceramic electronic component according to the embodiment.

The chip element body 2 and discrimination layers 5, 6 will be explained with reference to FIG. 2. FIG. 2 is a sectional view of the ceramic electronic component of the present embodiment. The sectional view shown in FIG. 2 is a cross section parallel to the two end faces 2a, 2b of the ceramic electronic component C1. The cross section of the ceramic electronic component C1 (chip element body 2) is square in the present embodiment.

The chip element body 2 is made of a ceramic (first ceramic) and has a plurality of internal electrode layers 7 arranged inside. The first ceramic making up the chip element body 2 consists of, for example, a material containing a major component of $BaTiO_3$ and additives such as $MgO$, $Y_2O_3$, $MnO$, $V_2O_5$, and, $BaSiO_3$ or $CaSiO_3$.

The plurality of internal electrode layers 7 are laminated together with a first ceramic layer of the first ceramic in between. The plurality of internal electrode layers 7 include internal electrode layers 7 arranged as shifted to the end face 2a side so that an end face of each internal electrode layer 7 is exposed in the end face 2a, and internal electrode layers 7 arranged as shifted to the end face 2b side so that an end face of each internal electrode layer 7 is exposed in the end face 2b. The internal electrode layers 7 arranged as shifted to the end face 2a side and the internal electrode layers 7 arranged as shifted to the end face 2b side are laminated alternately. The end faces of the internal electrode layers 7 shifted to the end face 2a side are electrically and physically connected to the first external electrode 3. The end faces of the internal electrode layers 7 shifted to the end face 2b side are electrically and physically connected to the second external electrode 4. The plurality of internal electrode layers 7 are juxtaposed in the opposing direction of the first side face 2c and the second side face 2d, i.e., in the laminate direction of the first ceramic layers.

The first to fourth side faces 2c-2f in the chip element body 2 are comprised of the first ceramic. The distance between the first side face 2c and the internal electrode layer 7 closest to the first side face 2c is approximately 300 μm. The distance between the second side face 2d and the internal electrode layer 7 closest to the second side face 2d is approximately 300 μm. The distance between the third side face 2e and each internal electrode layer 7 is approximately 200 μm. The distance between the fourth side face 2f and each internal electrode layer 7 is approximately 200 μm. The ends of the respective internal electrode layers 7 on the third side face 2e side and the ends thereof on the fourth side face 2f side are aligned when viewed from the opposing direction of the first side face 2c and the second side face 2d.

The thickness of the discrimination layers 5, 6 is approximately 30 μm. The discrimination layers 5, 6 are formed of a second ceramic different from the first ceramic. The discrimination layers 5, 6 have a color different from that of the first to fourth side faces 2c-2f of the chip element body 2.

For example, the first ceramic and the second ceramic are different in particle sizes of particles contained in the respective ceramics. If an average particle size or BET diameter of ceramic particles as the material of the second ceramic is smaller than an average particle size or BET diameter of ceramic particles as the material of the first ceramic, the degree of sintering of the second ceramic becomes higher than the degree of sintering of the first ceramic. In this case, the color of the second ceramic becomes darker than the color of the first ceramic. The average particle size of ceramic particles resulting from sintering of the second ceramic is smaller than that of the ceramic particles resulting from sintering of the first ceramic and the density of the second ceramic becomes higher than the density of the first ceramic. It can also be contemplated that the average particle size or BET diameter of ceramic particles as the material of the second ceramic is larger than the average particle size or BET diameter of ceramic particles as the material of the first ceramic. In this case, the color of the second ceramic becomes lighter than the color of the first ceramic.

The first ceramic and the second ceramic may be different in additives contained in the respective ceramics. For example, either one of the first and second ceramics may contain an additive that is not contained in the other and that changes an energy level in the bandgap to make the color different. It can also be contemplated that either one of the first and second ceramics contains an additive that shows different colors because of a difference between degrees of sintering.

The first ceramic and the second ceramic may be different in composition ratios of materials contained in the respective ceramics. For example, either one of the first and second ceramics may contain a larger amount of an additive to make the color different, or an additive to achieve different degrees of sintering, than the other.

In the ceramic electronic component C1, the plurality of internal electrode layers 7 are conductors arranged inside the chip element body 2. The plurality of internal electrode layers 7 are arranged in symmetry with respect to a plane passing the center of the chip element body 2 and being parallel to the end face 2a. The plurality of internal electrode layers 7 are also arranged in symmetry with respect to a plane passing the center of the chip element body 2 and being parallel to the first side face 2c. The plurality of internal electrode layers 7 are also arranged in symmetry with respect to a plane passing the center of the chip element body 2 and being parallel to the third side face 2e. The arrangement direction of the conductors is indicated by the laminate direction of the internal electrode layers 7. Namely, in the present embodiment the arrangement direction of the internal electrode layers 7 is a direction perpendicular to the discrimination layers 5, 6.

In the present embodiment, as described above, the chip element body 2 is comprised of the first ceramic and the discrimination layers 5, 6 are provided on the first side face 2c and on the second side face 2d, respectively. The discrimination layers 5, 6 are formed of the second ceramic different from the first ceramic and have the color different from that of the first to fourth side faces 2c-2f. Since the side faces 2c, 2d with the discrimination layers 5, 6 thereon in the chip element body 2 are perpendicular to the laminate direction of the internal electrode layers 7, the laminate direction of the internal electrode layers 7 can be determined by the discrimination layers 5, 6. Namely, the present embodiment permits the arrangement direction of the conductors (internal electrode layers 7) in the chip element body 2 to be readily determined based on the discrimination layers 5, 6.

The discrimination layer 5 or 6 is formed so as to cover the entire area of the first or second side face 2c or 2d, respectively. This permits us to easily confirm the difference of the colors between the discrimination layers 5, 6 and the third and fourth side faces 2e, 2f and thus to surely and easily confirm the color of the discrimination layers 5, 6.

The first ceramic and the second ceramic are different in particle sizes of particles of the major component contained in the respective ceramics. This makes it easy to provide the discrimination layers 5, 6 on the side faces 2c, 2d of the chip element body 2. Since the first ceramic and the second ceramic have the same components and composition ratio thereof, it is feasible to suppress delamination between the first and second side faces 2c, 2d of the chip element body 2 and the discrimination layers 5, 6.

The first ceramic and the second ceramic may be different in additives contained in the respective ceramics. Furthermore, the first ceramic and the second ceramic may be different in composition ratios of materials contained in the respective ceramics. In these cases, it is also easy to provide the discrimination layers 5, 6 on the side faces 2c, 2d of the chip element body 2. Since the first ceramic and the second ceramic contain the same major component, it is feasible to suppress delamination between the first and second side faces 2c, 2d of the chip element body 2 and the discrimination layers 5, 6. The first ceramic and the second ceramic have their respective colors different from each other because of a difference in part of their materials or because of a difference in an amount of a certain additive. Therefore, the discrimination layers 5, 6 can be readily formed.

Figure 3:
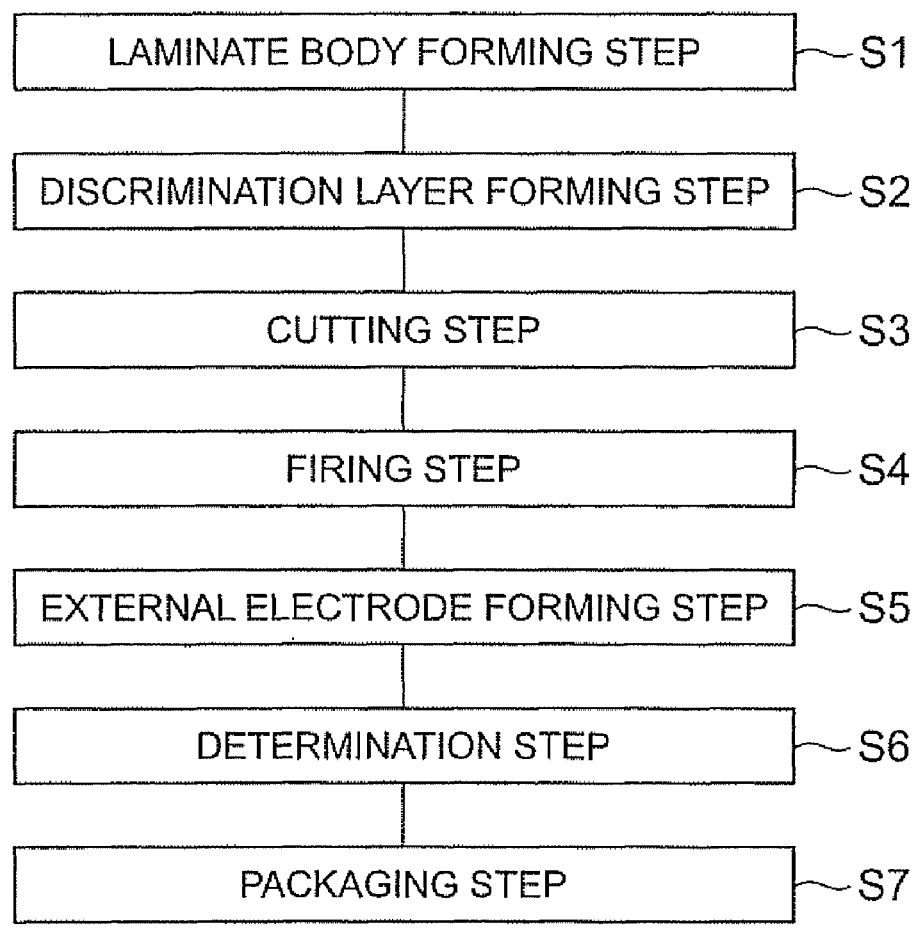
FIG. 3 is a flowchart showing a procedure of a manufacturing method and packaging method of ceramic electronic components according to the embodiment.

The following will describe a manufacturing method and packaging method of ceramic electronic components C1 according to the present embodiment. FIG. 3 is a flowchart showing a procedure of the manufacturing method and packaging method of ceramic electronic components according to the present embodiment. The manufacturing method of ceramic electronic components according to the present embodiment includes a laminate body forming step S1, a discrimination layer forming step S2, a cutting step S3, a firing step S4, and an external electrode forming step S5. Through these steps S1-S5, we obtain a plurality of ceramic electronic component C1 as described above. Each of the steps S1-S5 will be described below in detail.

Figure 4:
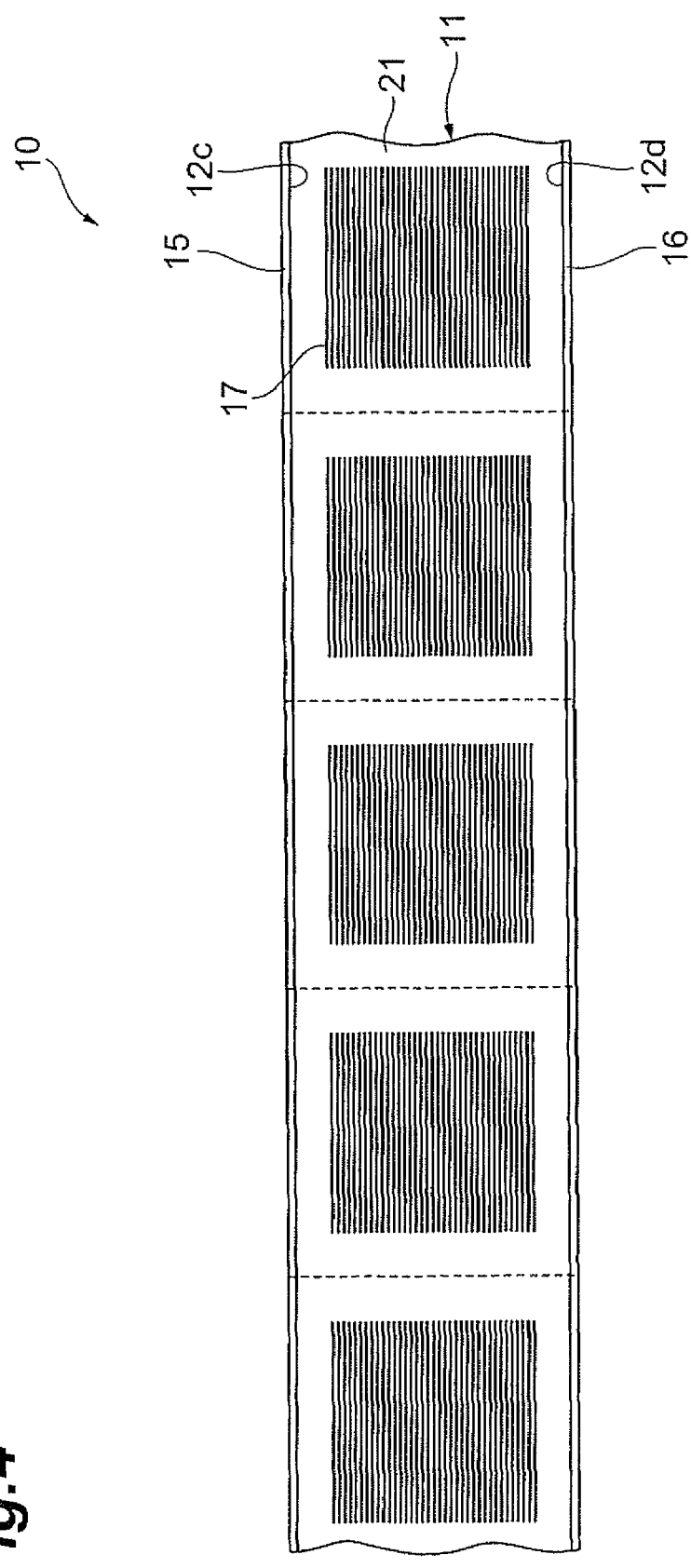
FIG. 4 is a sectional view of a laminate body formed in the manufacturing method of ceramic electronic components according to the embodiment.

In the laminate body forming step S1, as shown in FIG. 4, a plurality of first ceramic green layers 21 are laminated together to form a laminate body on which a plurality of electrode patterns 17 are provided. First, a first ceramic green layer 21 is formed on a PET (polyethylene terephthalate) film. The first ceramic green layer 21 turns into the first ceramic when fired. The first ceramic green layer 21 is formed by applying a ceramic slurry onto the PET film and thereafter drying it. The ceramic slurry is obtained by further adding a binder resin (e.g., an organic binder resin or the like), a solvent, a plasticizer, etc. to the first ceramic material containing the major component and additives, and mixing and dispersing them. For example, the major component of the first ceramic green layer 21 is $BaTiO_3$ and the additives are $MgO$, $Y_2O_3$, $MnO$, $V_2O_5$, $BaSiO_3$, and $CaSiO_3$.

Next, a plurality of electrode patterns 17 are formed on the top surface of the first ceramic green layer 21. The electrode patterns 17 are formed by printing an electrode paste on the top surface of the first ceramic green layer 21 and thereafter drying it. The electrode paste is a paste-like composition, for example, obtained by mixing a binder resin, a solvent, etc. in a metal powder of Ni, Ag, or Pd. The printing of the electrode paste is implemented, for example, by screen printing or the like.

Thereafter, a plurality of first ceramic green layers 21 with the electrode patterns 17 thereon are laminated together. A plurality of first ceramic green layers 21 without the electrode patterns 17 are laminated on each of the top and bottom of the plurality of first ceramic green layers 21 with the electrode patterns 17 thereon. These result in obtaining a laminate body.

Next, the discrimination layer forming step S2 is to form second ceramic green layers 15, 16 which will become the discrimination layers 5, 6. The second ceramic green layers 15, 16 are formed on faces 12c, 12d, respectively, which face each other in the laminate direction of the laminate body.

The second ceramic green layers 15, 16 turn into the second ceramic when fired. The second ceramic green layers 15, 16 are formed by applying a ceramic slurry onto the faces 12c, 12d and thereafter drying it. The ceramic slurry is obtained by further adding a binder resin (e.g., an organic binder resin or the like), a solvent, a plasticizer, etc. to the second ceramic material containing the major component and additives and mixing and dispersing them. The major component of the second ceramic green layers is $BaTiO_3$ and the additives are $MgO$, $Y_2O_3$, $MnO$, $V_2O_5$, and, $BaSiO_3$ or $CaSiO_3$. It is also possible to adopt an alternative method of applying the foregoing ceramic slurry onto a PET film, thereafter drying it to obtain a ceramic green sheet, and laminating the sheet onto the laminate body.

The second ceramic green layers 15, 16 are ceramic green layers different from the first ceramic green layers 21. The second ceramic green layers 15, 16 have the color after firing, different from the color after firing of the first ceramic green layers 21. For realizing the difference of colors, the first ceramic green layers 21 and the second ceramic green layers 15, 16 are made different, for example, in particle sizes of particles contained in the respective layers. It can also be contemplated that the first ceramic green layers 21 and the second ceramic green layers 15, 16 are made different in additives contained in the respective layers. It can also be contemplated that the first ceramic green layers 21 and the second ceramic green layers 15, 16 are made different in composition ratios of materials contained in the respective layers.

Figure 5:
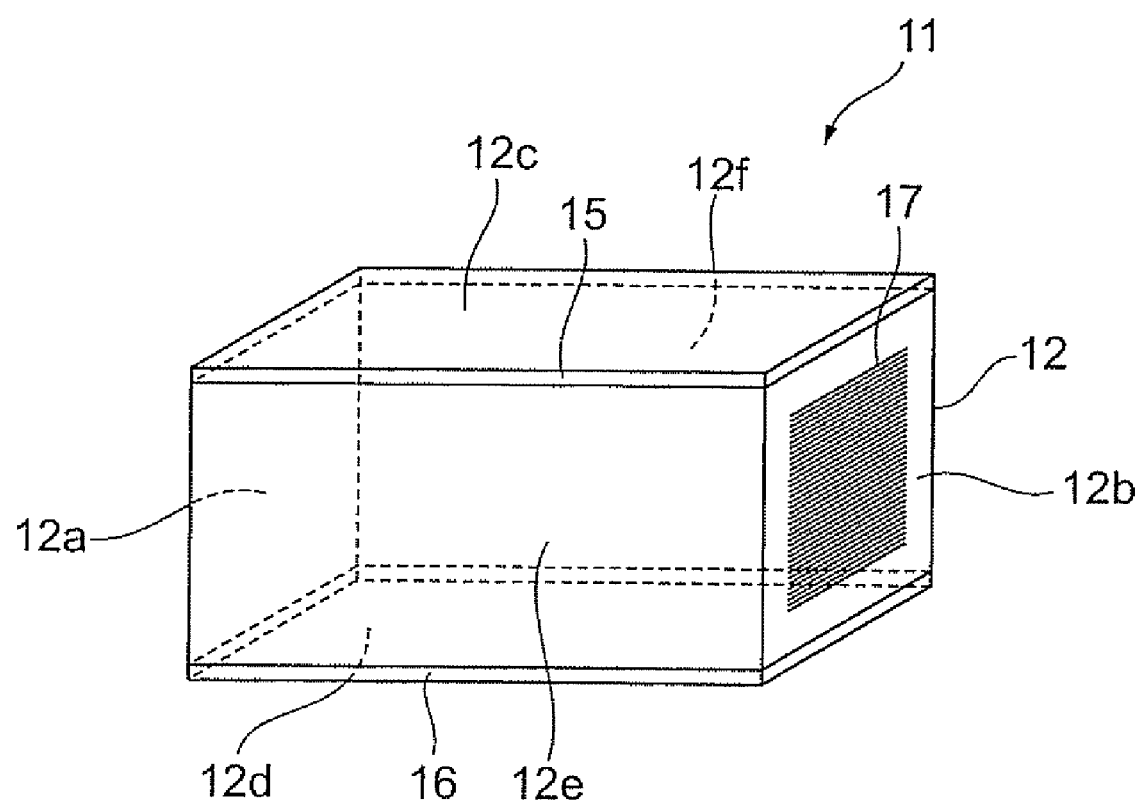
FIG. 5 is a perspective view of a laminate chip formed in the manufacturing method of ceramic electronic components according to the embodiment.

Next, the cutting step S3 is to cut the laminate body 10 in which the second ceramic green layers 15, 16 are formed, to obtain laminate chips 11, as shown in FIG. 5. A laminate chip 11 has two end faces 12a, 12b facing each other, a first side face 12c and a second side face 12d being perpendicular to each of the end faces 12a, 12b and facing each other, and a third side face 12e and a fourth side face 12f being perpendicular to each of the end faces 12a, 12b and the first and second side faces 12c, 12d and facing each other.

The ends of the electrode patterns are exposed in the two end faces 12a, 12b. The first side face 12c and the second side face 12d are composed of the second ceramic green layers 15, 16 formed by the discrimination layer forming step S2.

Next, the firing step S4 is to remove the binder from the first ceramic green layers 21 and the second ceramic green layers 15, 16 and fire the laminate chips. The firing changes the first ceramic green layers 21 of laminate chips 11 into the first ceramic, the second ceramic green layers 15, 16 into the discrimination layers 5, 6 of the second ceramic, and the internal electrode patterns 17 into the internal electrode layers 7. Namely, the firing results in obtaining chip element bodies 2 with the discrimination layers 5, 6.

The first to fourth side faces 2c-2d of the chip element bodies 2 have the color different from that of the discrimination layers 5, 6. For example, the BET diameter of ceramic particles in the first ceramic material is made larger or smaller than that of ceramic particles in the second ceramic. Since ceramic particles with a smaller BET diameter are generally sintered more at lower temperatures than ceramic particles with a larger BET diameter, a color of a ceramic resulting from firing of the smaller particles becomes darker, or has a lower luminance value L.

For example, it is conceivable that a $SiO_2$ compound or $TiO_2$ is added in only either one of the first ceramic material and the second ceramic material. A ceramic obtained from the ceramic material containing the $SiO_2$ compound or $TiO_2$ becomes darker in color than a ceramic obtained from the ceramic material not containing the $SiO_2$ compound or $TiO_2$, or has a lower luminance value L. It can also be contemplated that an amount of the $SiO_2$ compound or $TiO_2$ added in the first ceramic material is made larger or smaller than an amount of the $SiO_2$ compound or $TiO_2$ added in the second ceramic material. A ceramic obtained from the ceramic material containing the larger additive amount of the $SiO_2$ compound or $TiO_2$ becomes darker in color than a ceramic obtained from the ceramic material containing the smaller additive amount of the $SiO_2$ compound or $TiO_2$, or has a lower luminance value L. When the $SiO_2$ compound or $TiO_2$ or the like is added in a ceramic material, the ceramic material becomes easier to be sintered and more likely to be fired, so as to decrease the luminance value L.

It can also be contemplated that, for example, BaO, MgO, or $RE_2O_3$ (where RE is a rare earth) is added in only either one of the first ceramic material and the second ceramic material. A ceramic obtained from the ceramic material without BaO, MgO, or $RE_2O_3$ becomes darker in color than a ceramic obtained from the ceramic material containing BaO, MgO, or $RE_2O_3$, or has a lower luminance value L. When BaO, MgO, $RE_2O_3$, or the like is added in a ceramic material, the ceramic material becomes less easy to be sintered and thus becomes less likely to be fired, so as to increase the luminance value L.

It can also be contemplated that, for example, $V_2O_5$ is added in only either one of the first ceramic material and the second ceramic material. A ceramic obtained from the ceramic material containing $V_2O_5$ becomes darker in color than a ceramic obtained from the ceramic material not containing $V_2O_5$, or has a lower luminance value L. It can also be contemplated that an amount of $V_2O_5$ added in the first ceramic material is made larger or smaller than an amount of $V_2O_5$ added in the second ceramic material. A ceramic obtained from the ceramic material containing the larger additive amount of $V_2O_5$ becomes darker in color than a ceramic obtained from the ceramic material containing the smaller additive amount of $V_2O_5$, or has a lower luminance value L. The addition of V changes the band structure of $BaTiO_3$.

Next, the external electrode forming step S5 is to form the first external electrode 3 and the second external electrode 4 on the two end faces 2a, 2b, respectively, of each chip element body 2. This causes the internal electrode layers 7 to be electrically connected to the first external electrode 3 or to the second external electrode 4. The steps described above complete a plurality of ceramic electronic components C1.

Subsequently, the packaging method of ceramic electronic components according to the present embodiment will be described. The packaging method of ceramic electronic components according to the present embodiment includes a preparation step, a determination step S6, and a packaging step S7. First, the preparation step is to carry out the above-described steps S1-S5 to prepare a plurality of ceramic electronic components C1.

Next, the determination step S6 is to determine the laminate direction of internal electrode layers 7 in each ceramic electronic component C1, based on the difference between the colors of the third or fourth side face 2e, 2f and the discrimination layers 5, 6. The colors of two side faces adjacent to each other, out of the side faces except for the end faces with the external electrodes 3, 4 in the ceramic electronic component C1 are measured by a calorimeter. Whether a measured side face is the discrimination layer 5, 6 or the third or fourth side face 2e, 2f is decided based on a difference between luminance values L of the two side faces.

The colorimeter can be a spectral color difference meter (spectrophotometer). This spectrophotometer is used to measure the luminance values L in the CIE (Commission Internationale d'Eclairage) 1976 L*a*b* (CIELAB) (JIS Z8729). Whether a measured side face is the discrimination layer 5, 6 or the third or fourth side face 2e, 2f is decided based on the difference between the luminance values L. When a measured side face is the discrimination layer 5, 6, the measured side face is a surface perpendicular to the laminate direction of the internal electrode layers. When a measured side face is the third or fourth side face 2e, 2f, the measured face is a surface parallel to the laminate direction of the internal electrode layers.

Figure 6:
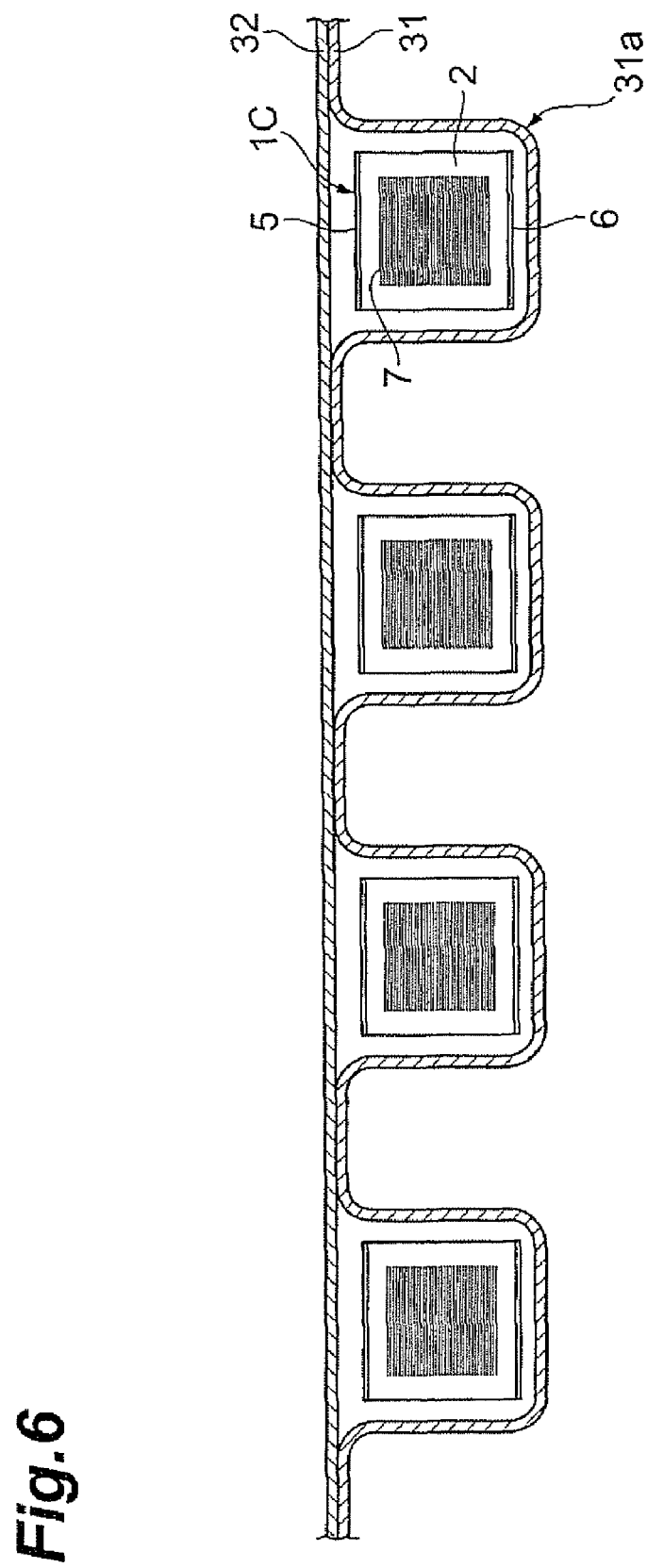
FIG. 6 is a sectional view showing a packaged state of ceramic electronic components according to the embodiment.

Next, the packaging step S7, as shown in FIG. 6, is to arrange and package a plurality of ceramic electronic components C1 with the laminate directions of internal electrode layers thereof being aligned. A packaging material consists of a packaging material 31 and a packaging material 32. A plurality of recesses 31a with a cross section of a rectangular shape are formed in a two-dimensional array in the packaging material 31. The ceramic electronic components C1 are housed in the respective recesses 31a.

Each ceramic electronic component C1 is housed in a recess 31a so that the discrimination layers 5, 6 are perpendicular to the depth direction of the recess 31a. Namely, the ceramic electronic component C1 is housed in the recess 31a so that the laminate direction of the internal electrode layers 7 is parallel to the depth direction of the recess 31a. Thereafter, openings of the recesses 31a are covered by the packaging material 32, thereby completing packaging.

In the manufacturing method of the present embodiment, as described above, the discrimination layer forming step S2 is configured to form the second ceramic green layers 15, 16, which will become the discrimination layers 5, 6, on the mutually facing faces 12c, 12d of the laminate body, which will become a matrix of chip element bodies 2, then cut the laminate body into chips, and fire them. This process permits us to simply obtain the chip element bodies 2 with the discrimination layers 5, 6 of the second ceramic on the first side face 2c and on the second side face 2d. The discrimination layers 5, 6 of the second ceramic have the color different from that of the third and fourth side faces 2e, 2f of the chip element body 2 of the first ceramic. The discrimination layers 5, 6 are perpendicular to the laminate direction of the internal electrode layers 7. Therefore, it allows us to simply determine the laminate direction of the internal electrode layers 7, based on the discrimination layers 5, 6.

In the packaging method of ceramic electronic components according to the present embodiment, the ceramic electronic components C1 are first prepared. Since the discrimination layers 5, 6 are provided on the side faces perpendicular to the laminate direction of the internal electrode layers 7, the laminate direction of the internal electrode layers 6 can be readily determined based on the discrimination layers 5, 6 in the determination step S6. Then the plurality of ceramic electronic components C1 can be packaged with their laminate directions of the internal electrode layers 7 being aligned, in the packaging step S7.

During mounting, each ceramic electronic component C1 can be mounted on a substrate with the same laminate direction of the internal electrode layers 7. As a result of this, it is feasible to suppress variation in electrical characteristics of the ceramic electronic component C1 and other electronic components on the substrate.

In the packaging method of ceramic electronic components according to the present embodiment, the determination step S6 is configured to determine the difference between the colors of the third or fourth side face 2e, 2f and the discrimination layer 5, 6 by measuring the difference between the luminance values L in the CE 1976 L*a*b* (CIELAB). Since this allows us to accurately determine the difference of colors, the laminate direction of the internal electrode layers can be accurately determined.

The first ceramic green layers to turn into the first ceramic after firing and the second ceramic green layers to turn into the second ceramic after firing are different in the BET diameters of particles of the major component contained in the respective layers. This makes it easy to provide the discrimination layers 5, 6 of the second ceramic different in color from the first ceramic, on the side faces of the chip element body 2. Since the first and second ceramics have the same components and composition ratio thereof, it is feasible to suppress occurrence of delamination between the first and second side faces 2c, 2d of the chip element body 2 and the discrimination layers 5, 6.

The first ceramic green layers and the second ceramic green layers to turn into the first ceramic and the second ceramic may be different in additives contained in the respective layers. The first ceramic green layers and the second ceramic green layers to turn into the first ceramic and the second ceramic may be different in composition ratios of materials contained in the respective layers. In either case, the discrimination layers 5, 6 of the second ceramic different in color from the first ceramic can be readily provided on the side faces of the chip element body 2. Since the first ceramic and the second ceramic contain the same major component, it is feasible to suppress occurrence of delamination between the first and second side faces 2c, 2d of the chip element body 2 and the discrimination layers 5, 6.

In general, a chip element body of a ceramic electronic component has such a shape that the first and second side faces perpendicular to the laminate direction of the internal electrode layers are convex and that the third and fourth side faces parallel to the laminate direction are concave. Therefore, an installation state of a ceramic electronic component will differ depending upon either a case where the ceramic electronic component is mounted on the substrate with the first side face or the second side face as a mounting surface or a case where the ceramic electronic component is mounted on the substrate with the third or fourth side face as a mounting surface. If the ceramic electronic components mounted on the substrate include those with the mounting surface of the first or second side face and those with the mounting surface of the third or fourth side face, the installation accuracy will vary.

In contrast to it, the packaging method of ceramic electronic components according to the present embodiment permits the ceramic electronic components to be packaged with their laminate directions of internal electrode layers 7 being aligned. This allows a ceramic electronic component C1 taken out of the packaging material, to be mounted on a substrate without change in the laminate direction of the internal electrode layers 7, which suppresses the variation in installation accuracy of ceramic electronic components C1.

For taking each ceramic electronic component C1 out of the packaging material, a mounter nozzle is generally used to suck the ceramic electronic component C1 by making use of a negative pressure. Since on this occasion the ceramic electronic component is taken out while sucking the side face thereof on the opening side of the packaging material, it is easier to suck the ceramic electronic component C1 in the case where the side face is convex than in the case where the side face is concave. In the packaging method of ceramic electronic components according to the present embodiment, the first or second side face 2c, 2d is located on the opening side of the packaging material, and therefore the convex first or second side face 2c, 2d is sucked. It is thus easy to perform sucking and conveyance.

The above described the preferred embodiments of the present invention, but it is noted that the present invention is by no means limited to these embodiments. For example, the ceramic electronic component C1 according to the embodiment of the present invention was the multilayer chip capacitor, but the present invention is not limited to it. The ceramic electronic component may be a multilayer piezoelectric body, varistor, inductor, or the like. The ceramic electronic component C1 according to the embodiment of the present invention is provided with a plurality of conductors (internal electrode layers 7), but the present invention is not limited to it. The number of conductor may be one.

For example, in the ceramic electronic component C1 according to the foregoing embodiment, the discrimination layers 5, 6 are provided on the first side face 2c and on the second side face 2d, respectively, of the chip element body 2, but the present invention is not limited to it. It can also be contemplated that the discrimination layer is provided on only either one side face out of the first side face 2c and the second side face 2d. The discrimination layers may also be provided on the side faces being parallel to the laminate direction and facing each other in the chip element body 2. It is also possible to provide a discrimination layer on a part of any one of the first to fourth side faces.

EXAMPLES

The present invention will be described below in more detail with examples thereof, but it should be noted that the present invention is by no means intended to be limited to these examples.

Examples 1-12 represent the ceramic electronic components manufactured by the manufacturing method of ceramic electronic components according to the aforementioned embodiment and Comparative Example 1 represents a ceramic electronic component without the discrimination layers manufactured without the discrimination layer forming step in the manufacturing method of ceramic electronic components according to the foregoing embodiment.

FIG. 7 shows the materials of the ceramic green layers and the measurement results with a spectrophotometer in Comparative Example 1 and Examples 1-12. The measurement results with the spectrophotometer are expressed by the CIE 1976 L*a*b* (CIELAB). The spectrophotometer used was micro spectrophotometer VSS 400 available from Nippon Denshoku Industries Co., Ltd.

In FIG. 7, Comparative Example 1 shows the material of the first ceramic green layers. Similarly, Examples 1-12 show the material of the second ceramic green layers, i.e., the material of the discrimination layers. The material of the first ceramic green layers forming the third and fourth side faces in Examples 1-12 is the same as the material of the first ceramic in Comparative Example 1.

In Comparative Example 1, the difference between the luminance value L of the discrimination layer and the luminance value L of the third or fourth side face was 0.7 (=80.9−80.2). This luminance difference is a value within a range of measurement error, and it was thus impossible to discriminate the discrimination layer on the basis of the luminance values.

Example 1 is an example in which the BET diameter of $BaTiO_3$ thereof is larger than that in Comparative Example 1, and Example 2 is an example in which the BET diameter of $BaTiO_3$ thereof is smaller than that in Comparative Example 1. In Example 1, the difference between the luminance value L of the discrimination layer and the luminance value L of the third or fourth side face was −5.6 (=75.3−80.9). In this case, it was feasible to discriminate the discrimination layer on the basis of the luminance values. In Example 2, the difference between the luminance value L of the discrimination layer and the luminance value L of the third or fourth side face was 8.2 (=88.9−80.7). In this case, it was also feasible to discriminate the discrimination layer on the basis of the luminance values.

Example 3 is an example in which the molar ratio of A-site atom to B-site atom in $BaTiO_3$ is smaller than that in Comparative Example 1, and Example 4 is an example in which the molar ratio of A-site atom to B-site atom in $BaTiO_3$ is larger than that in Comparative Example 1. In Example 3, the difference between the luminance value L of the discrimination layer and the luminance value L of the third or fourth side face was −6.9 (=73.7−80.6). In this case, it was feasible to discriminate the discrimination layer on the basis of the luminance values. In Example 4, the difference between the luminance value L of the discrimination layer and the luminance value L of the third or fourth side face was 8.7 (=89.0−80.4). In this case, it was also feasible to discriminate the discrimination layer on the basis of the luminance values.

Example 5 is an example in which the additive amount of MgO is larger than that in Comparative Example 1, and Example 6 is an example in which the additive amount of MgO is smaller than that in Comparative Example 1. In Example 6, the difference between the luminance value L of the discrimination layer and the luminance value L of the third or fourth side face was −8.0 (=73.2−81.2). In this case, it was feasible to discriminate the discrimination layer on the basis of the luminance values. In Example 6, the difference between the luminance value L of the discrimination layer and the luminance value L of the third or fourth side face was 8.8 (=89.0−80.2). In this case, it was also feasible to discriminate the discrimination layer on the basis of the luminance values.

Example 7 is an example in which the additive amount of $Y_2O_3$ is larger than that in Comparative Example 1, and Example 8 is an example in which the additive amount of $Y_2O_3$ is smaller than that in Comparative Example 1. In Example 7, the difference between the luminance value L of the discrimination layer and the luminance value L of the third or fourth side face was −8.3 (=71.9−80.3). In this case, it was feasible to discriminate the discrimination layer on the basis of the luminance values. In Example 8, the difference between the luminance value L of the discrimination layer and the luminance value L of the third or fourth side face was 7.2 (=87.9−80.7). In this case, it was also feasible to discriminate the discrimination layer on the basis of the luminance values.

Example 9 is an example in which the additive amount of $V_2O_5$ is larger than that in Comparative Example 1, and Example 10 is an example in which the additive amount of $V_2O_5$ is smaller than that in Comparative Example 1. In Example 9, the difference between the luminance value L of the discrimination layer and the luminance value L of the third or fourth side face was −15.3 (=65.3−80.6). In this case, it was feasible to discriminate the discrimination layer on the basis of the luminance values. In Example 10, the difference between the luminance value L of the discrimination layer and the luminance value L of the third or fourth side face was 9.7 (=90.3−80.6). In this case, it was also feasible to discriminate the discrimination layer on the basis of the luminance values.

Example 11 is an example in which the additive amount of $(Ba,Ca)SiO_3$ is larger than that in Comparative Example 1, and Example 12 is an example in which the additive amount of $(Ba,Ca)SiO_3$ is smaller than that in Comparative Example 1. In Example 11, the difference between the luminance value L of the discrimination layer and the luminance value L of the third or fourth side face of 80.2 was −6.6 (=73.7−80.2). In this case, it was feasible to discriminate the discrimination layer on the basis of the luminance values. In Example 12, the difference between the luminance value L of the discrimination layer and the luminance value L of the third or fourth side face was 8.8 (=89.0−80.2). In this case, it was also feasible to discriminate the discrimination layer on the basis of the luminance values.

It is apparent as described above that the discrimination layer can be relatively accurately discriminated as long as the difference between the luminance value of the discrimination layer and the luminance value of the third or fourth side face is not less than 1.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A packaging method of ceramic electronic components comprising:
    a preparation step of preparing a plurality of ceramic electronic components, each ceramic electronic component including:
        a chip element body having first and second end faces facing each other, first and second side faces being perpendicular to the first and second end faces and facing each other, and third and fourth side faces being perpendicular to the first and second end faces and to the first and second side faces and facing each other, said chip element body having a conductor arranged inside;
        external electrodes formed on the first and second end faces, respectively, of the chip element body; and
        a discrimination layer provided on at least one side face out of the first side face and the second side face in the chip element body,
        wherein the chip element body is comprised of a first ceramic, and wherein the discrimination layer is comprised of a second ceramic different from the first ceramic and has a color different from that of the third and fourth side faces;

a determination step of determining an arrangement direction of the conductor in each of the ceramic electronic components, based on the difference between the colors of at least one side face out of the third and fourth side faces, and the discrimination layer; and a packaging step of packaging the plurality of ceramic electronic components with the arrangement directions thereof being aligned, based on the arrangement directions determined in the determination step.

2. The packaging method of ceramic electronic components according to claim 1,
wherein the discrimination layer is provided so as to cover an entire area of said at least one side face.

3. The packaging method of ceramic electronic components according to claim 1,
wherein the first ceramic and the second ceramic have different colors resulting from a difference between degrees of sintering thereof.

4. The packaging method of ceramic electronic components according to claim 1,
wherein the first ceramic and the second ceramic are different in particle sizes of particles contained in the respective ceramics.

5. The packaging method of ceramic electronic components according to claim 1,
wherein the first ceramic and the second ceramic are different in additives contained in the respective ceramics.

6. The packaging method of ceramic electronic components according to claim 1,
wherein the first ceramic and the second ceramic are different in composition ratios of materials contained in the respective ceramics.

7. The packaging method of ceramic electronic components according to claim 1,
wherein the conductor comprises a plurality of conductors arranged in a laminate direction to the first side face and the second side face.

8. The packaging method of ceramic electronic components according to claim 1,
wherein the determination step comprises discriminating the difference between the colors of said at least one side face out of the third and fourth side faces, and the discrimination layer, based on a difference between luminance values of said at least one side face out of the third and fourth side faces, and the discrimination layer.

* * * * *